(12) United States Patent
Price et al.

(10) Patent No.: US 6,784,045 B1
(45) Date of Patent: Aug. 31, 2004

(54) MICROCHANNEL FORMATION FOR FUSES, INTERCONNECTS, CAPACITORS, AND INDUCTORS

(75) Inventors: David T. Price, Gresham, OR (US); Jayashree Kalpathy-Cramer, West Linn, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/646,570

(22) Filed: Aug. 22, 2003

(51) Int. Cl.[7] .................... H01L 21/8238; H01L 21/44
(52) U.S. Cl. .................. 438/215; 438/132; 438/601; 257/209
(58) Field of Search .................. 257/209; 438/128–132, 438/214, 215, 467, 598–601

(56) References Cited

U.S. PATENT DOCUMENTS 6,174,802 B1 * 1/2001 Huang et al. ............... 438/637
6,211,698 B1 * 4/2001 Suh ............................. 326/60

* cited by examiner

Primary Examiner—Matthew Smith
Assistant Examiner—Calvin Lee
(74) Attorney, Agent, or Firm—Beyer, Weaver & Thomas

(57) ABSTRACT

The present invention provides a method for forming interconnect lines and conductors and passive devices in the fabrication of an integrated circuit. A gap is created in the patterning of a first layer. The gap is filled by a dielectric material so that an encapsulated conduit is formed in the gap. The encapsulated conduit is filled with a conductor by chemical vapor deposition processes or other deposition processes, the filling facilitated by forming via holes to intersect the conduit, and then filling the via holes. The conductor filled conduit can be used as a resistor, fuse, inductor, or capacitor.

21 Claims, 4 Drawing Sheets

MICROCHANNEL FORMATION FOR FUSES, INTERCONNECTS, CAPACITORS, AND INDUCTORS

BACKGROUND OF THE INVENTION

1. Field of the Invention

The present invention relates to fuses and interconnects formed on semiconductor wafers and the methods for forming them. More particularly, the present invention relates to methods for forming channels on semiconductor wafers to form fuses and interconnects.

2. Description of the Related Art

Designers and semiconductor device manufacturers constantly strive to develop smaller devices from wafers, recognizing that circuits with smaller features generally produce greater speeds and increased packing density, therefore increased net die per wafer (numbers of usable chips produced from a standard semiconductor wafer). However, with smaller devices a limiting factor in achieving smaller features and nodes is the wavelength of the light used in the photolithographic process to produce the features.

Photolithography is one of the most important steps of the semiconductor manufacturing process. During the photolithographic process a semiconductor wafer is coated with a light sensitive material called a photoresist or resist and is exposed with an actinic light source. The exposure light passes through a photomask and is imaged via projection optics onto the resist coated wafer forming a reduced image of the photomask in the photoresist. For positive chemically amplified resists, the actinic light source typically causes the production of photoacids that diffuse during post exposure bake and allow the resist to be rinsed away by an aqueous developer in only the regions receiving at least a threshold exposure dose. The last step in the photolithographic process involves etching the resist-coated wafers to attack the semiconductor material not covered with photoresist.

Unfortunately, in order to increase the density on the wafer, i.e., to generate features on the wafer that are smaller than available using the current generation of the photolithography equipment, it is typically necessary to undertake major processing equipment expenditures.

As semiconductor devices, such as integrated circuit chips, continue to decrease in size and increase in complexity, the likelihood of a defective chip resulting from a failed element or a defective conductor increases. One way to reduce the number of chips which must be discarded due to fabrication defects is to manufacture fuses into semiconductor devices. Fuses may be opened to isolate defective areas and allow the rest of the circuit on a chip to be used. Fuses may also be used to trim a circuit, enable a particular mode, or enable or disable different segments of a circuit, such as for example in configuring customer circuits on programmable logic devices (PLD's).

Often it is desirable to create fuses or other components having dimensions smaller than the other patterned features in a particular layer on a wafer. Thus, even though it may be desirable to form a fuse having a much smaller width than the interconnect lines in the same layer, conventional patterning and fill techniques limit the variance in widths that can be efficiently filled in the same step.

For example, scaling of devices may result in a device structure having one or more thick metal redistribution layers to efficiently distribute power across the chip while minimizing the voltage drop along the power lines. Generally it is advisable to have thick redistribution metal layers to avoid a voltage drop from the periphery to the center of the chip. However, these thick redistribution layers may be unsuitable for use in the formation of metal fuses. Redistribution layers, for example, may be about 1.0 to 3.0 microns in thickness in 0.13 micron device technology, thus making it difficult to blow the fuse without exceeding the thermal capacity of the device. Copper's high thermal conductance characteristic requires greater heat to blow the fuse than a same thickness fuse made from other metals such as aluminum. It would be desirable to form thin fuses in the same level as the redistribution layers.

Unfortunately, there is no conventional process that resolves these patterning issues in a satisfactory manner. Accordingly, what is needed is an improved process for forming very small conductive channels that can be integrated in the same layer with conventional patterned features having larger dimensions, thus increasing the density of the chips and providing greater flexibility.

SUMMARY OF THE INVENTION

To achieve the foregoing, the present invention provides methods for forming interconnects and fuses on a semiconductor wafer in small enclosed conduits, i.e., microchannels. The processing sequence involves forming on a wafer a structure having sufficient topography such as a gap between two structures to create an enclosed conduit when a dielectric is deposited to fill the gap. Via holes are then formed to intersect the enclosed hollow conduit. The conduit is then filled followed by planarization to yield a conductive line located in the gap or trench defined by the patterned structures. By processing the semiconductor wafer in this manner, conductive lines of small cross-section may be formed, as may be suitable for resistors, fuses and other applications.

According to one embodiment, a method of forming a conductive line on a semiconductor substrate is provided. A trench is first formed on the semiconductor wafer. A dielectric material is deposited in the trench to form a hollow enclosed conduit. One or more via holes are formed in the dielectric and configured to intersect the hollow enclosed conduit. The hollow conduit is then filled using at least one via hole. Preferably, at least one of the via holes are filled and used to make electrical connection to the conduit.

According to another embodiment, the conductive line is formed by a metal selected from Ti, TiN, W, Al, Cu, and Mb. According to yet another embodiment, the conduit is configured to form one of a fusible link, resistor, capacitor, interconnect, and inductor.

According to yet another embodiment, the conductive line is formed from a conduit that is hollow. The hollow conductive line is then filled with a dielectric material in an annular shape. The space defined by the annular shape is then filled with a second conductive material to form a second conductive line.

These and other features and advantages of the present invention are described below with reference to the drawings.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1A:
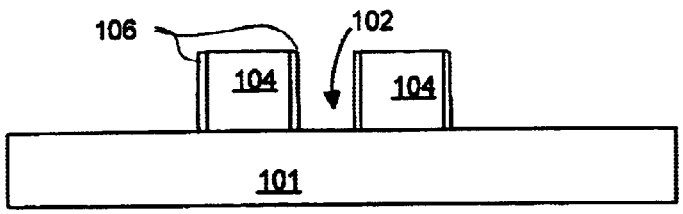
FIGS. 1A–1G are diagrams illustrating a method of forming an interconnect in accordance with one embodiment of the present invention.

FIGS. 1A–1G are diagrams illustrating a method of forming an interconnect in accordance with one embodiment of the present invention. The process begins as illustrated in FIG. 1A with a trench 102 formed on a semiconductor wafer 101. The trench 102 may be formed by one of several alternative methods. Preferably, the trench 102 is defined by local interconnects 104 defined in a layer deposited on the substrate. Local interconnects 104 may be formed by methods known to those of skill in the relevant art and therefore complete details are believed to be unnecessary here. For example, a polysilicon layer may be deposited by conventional techniques, for example by chemical vapor deposition, followed by the use of photolithographic techniques to pattern and subsequently etch the layer to form the gates or local interconnects.

Sidewall spacers 106 may also be formed on the sidewalls of the polylines or gates, again according to conventional methods to ensure electrical isolation of the polylines or local interconnects 104.

Figure 1B:
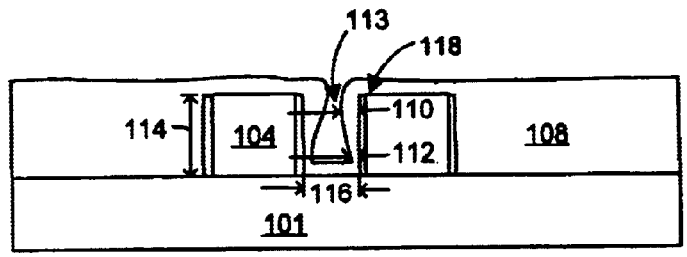

Next, as illustrated in FIG. 1B, a dielectric layer 108 is deposited in the trench created by the structure formed on the semiconductor substrate 101. The dielectric layer may be any deposited nonconductive layer. For example, the dielectric layer 108 may be a plasma deposited oxide, for example TEOS or silane.

The present invention takes advantage of the tendency of deposited dielectrics formed on a structure having at least one steep sidewall to produce voids from the effect of an overhang. That is, as the dielectric layer 108 is deposited, given a trench 102 having a large enough aspect ratio, i.e., the height 114 of the trench 102 divided by the width 116, voids will tend to appear in the deposited dielectric layer 108. Without intending to be limited by any theory, it is believed that an overhang 110 will be created at the one of the upper corners 118 of the structure defining the trench 102. The overhang is typically quantified as a measure of the thickness of the deposited layer 110 at the top of the trench 102 relative to the lower thickness 112 of the layer at the bottom portion of the sidewall of the trench 102, for example in percent terms, overhang thickness 110—lower thickness 112, divided by lower thickness 112.

At some point during the process of depositing the dielectric layer 108, the dielectric at the level of the overhang thickness 110 from opposing sides of the trench 102 will meet, thus in some cases depending upon the process parameters encapsulating a void in the dielectric 108. Much effort in process engineering has been devoted to tuning the deposition process to avoid the formation of the void or conduit 120. Selecting the process parameters so that the overhang thickness 110 relative to the dielectric thickness 112 at the bottom of the sidewall of the trench 102 is sufficiently controlled and controlling the trench width effectuates the formation of the conduit 120 with controlled dimensions. The formation of the overhang 110 is process dependent. Any gap filling process may be used to deposit the dielectric 108 and subsequently form the void or conduit 120.

Figure 1C:
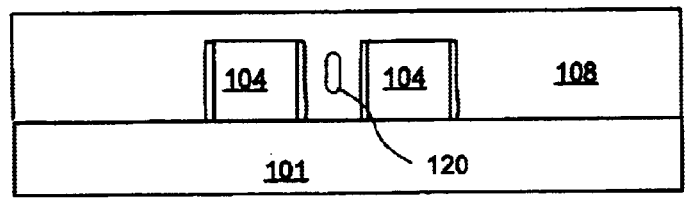

In other words, the conduit 120 is formed by first creating a suitable topography or structures on the substrate followed by a controlled gap filling process. Suitable aspect ratios of the trench are believed to be 1 or greater, although the invention is not so limited. Preferably, the gap filling process in one embodiment is a low conformality chemical vapor deposition or physical vapor depositions (PVD) process. In one embodiment, the gap filling process is a plasma enhanced chemical vapor deposition (PECVD). Thus, as illustrated in FIG. 1C, the deposition process is controlled to form the hollow enclosed conduit 120 in the trench 102 now substantially filled with dielectric 108. Preferably, the width of the conduit 120 is approximately ½ the width of the trench 102 or less. Methods of controlling the deposition process parameters and the configuration of the prominences on either side of the trench (i.e., adjusting the aspect ratio of the trench) are known to those of skill in the art and thus suitable ranges can be determined with minimal experimentation. Thus with the benefit of the guidance provided herein, one skilled in the art could reliably form reproducible conduit dimensions. The prominences, for example and not intended to be limiting, may include raised structures or features such as patterned gates or lines formed in polysilicon layers, with a gap (or trench) between them.

Figure 1D:
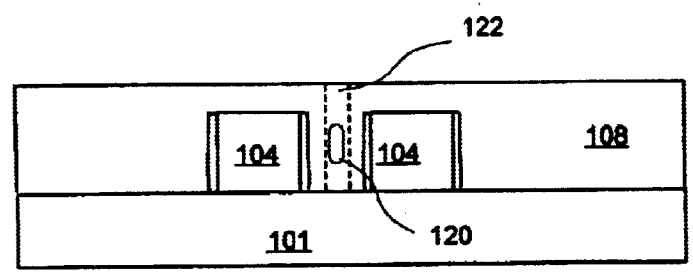

Next, as illustrated in FIG. 1D, a via hole 122 is formed in the dielectric layer 108 to intersect the hollow conduit 120. The via hole 122 may be formed by any suitable technique for forming via holes or contact holes as known to those of skill in the relevant art. Preferably, the via hole 122 is formed by patterning and etching the dielectric layer 108. The diameter of the via hole 122 should be sufficient in light of the dimensions of the hollow conduit 120 and the photomask tolerances to ensure that the via hole 122 reliably intersects the hollow conduit 120.

Figure 1E:
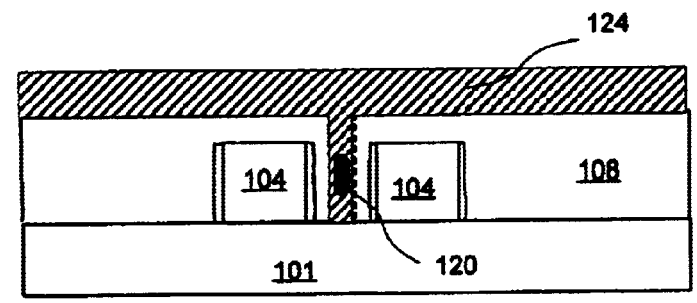

As illustrated in FIG. 1E, the via hole 122 and the conduit 120 are then filled preferably with a conductive material to form conductive line 125 (i.e., the filled conduit) and via 126. Preferably, the hollow conduit 120 is filled with a conductive metal, the via hole 122 configured to facilitate deposition of the conducting material into the conduit 120. Ti, TiN, W, Al, Cu, and Mb are all suitable conductive materials for deposition in the conduit. Alternatively, an oxide or other dielectric may be deposited in the conduit, for example, to form a signal transmission line such as optical interconnect or light pipe.

Preferably the via hole 122 will be for configured so that the conductive metal or other conductive material deposited preferably by CVD, atomic layer deposition (ALD), or plasma enhanced chemical vapor deposition (PECVD) means will flow into and suitably fill the conduit 120. Although not intended to be limiting, in one embodiment, the diameter of the via hole is at least two times the cross-sectional width of the conduit. It is recognized that improved filling reliability may be obtained by positioning via holes 122 at periodic locations along the conduit 120. That is, by placing via holes along the conduit 120 at intervals that don't exceed a maximal fill distance, the integrity of the conductive line 125 may be improved. The maximal fill distance may be determined experimentally as based on various parameters of the fill process, including but not limited to the shape and diameter of the conduit 120, the method of depositing the fill material, and the composition of the fill material (i.e., the conductive material). Preferably, the conductive material 124 is filled into the via holes 122 and the conduit 120 using a chemical vapor deposition process or atomic layer deposition (ALD). In an alternative embodiment, a PECVD process is used to fill the conduit, for example, a PECVD TEOS process having sufficient surface mobility to fill the conduit. According to another embodiment, vapor phase deposition techniques (such as including parylene for insulator materials) are used to fill the conduit. These example process techniques are intended to be illustrative and not limiting.

By using two or more via holes, evacuation of byproducts from depositing the conductive material 124 is enhanced, thus minimizing the inhibition of the fill process. It should be noted that all of the via holes need not be used to make electrical contact with other portions of the circuit. That is, in some cases they are used only for filling the enclosed conduit.

Figure 1F:
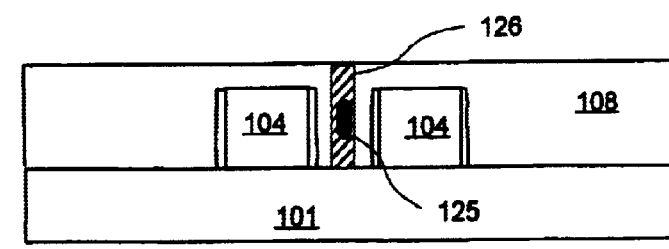

Next, as illustrated in FIG. 1F, planarization of the conductive layer 124 takes place. For example, planarization may be implemented using chemical mechanical polishing techniques as known to those of skill in the art. Preferably, planarization continues until the dielectric layer 108 is exposed.

Figure 1G:
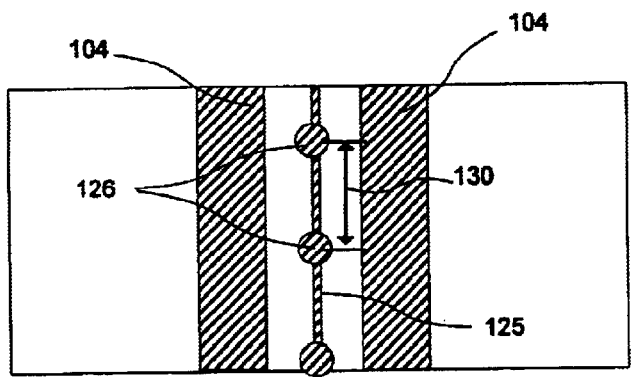

FIG. 1G illustrates a top view of the completed conductive line 125. For clarity of illustration, sidewall spacers 106 are not shown. Although the sidewall spacers are illustrated in FIGS. 1A–1F on the sides of the poly lines 104, these are illustrative and not intended to be limiting. The trench 102 may be formed in a variety of ways known to those of skill in the art, such as including in the silicon substrate in a manner similar to the formation of Shallow trench isolation (STI) trenches or by etching a trench in an oxide layer. The trench may alternatively be formed in inter-level dielectrics (ILD) such as the pre-metal dielectric (PMD) or inter-metal dielectrics (IMD). That is, the trench may be formed between patterned gates or local interconnects in the PMD or between patterned metal lines or other conductive lines in any of the interconnect levels. These examples are intended to be illustrative and not limiting.

As shown, the conductive line 125 is electrically accessed though the filled vias 126. Connection to the conductor line, through the vias 126, may be achieved through the electrical connection of metal layers overlying or underlying the dielectric layer 108, as will be described in greater detail below. As further shown, the vias 126 are positioned with a maximal fill distance 130 between the adjacent vias 126.

Figure 2A:
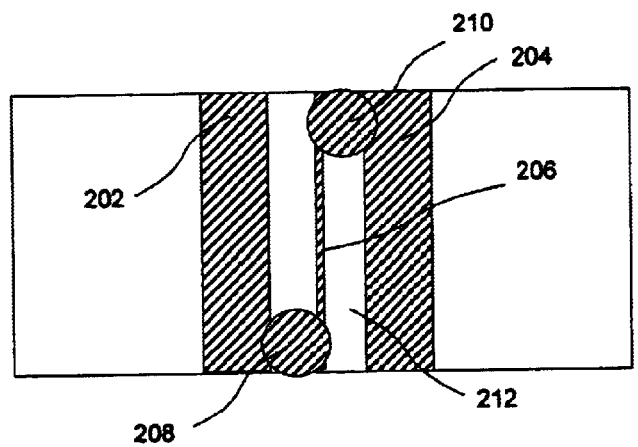
FIG. 2A is a top diagrammatic view illustrating electrical connections formed between patterned metal lines and a conduit in accordance with one embodiment of the present invention.

FIG. 2A is a top view of a diagram illustrating electrical connections formed in accordance with one embodiment of the present invention. In this diagram, the structure providing the topography for the creation of the hollow enclosed conduit includes local interconnects 202 and 204. As described above in relation to FIGS. 1A–1G, these local interconnects may be formed by conventional methods, such as for example in forming and patterning polysilicon gates. The conduit is shown filled to form conductive line 206 in dielectric layer 212. External connection to this line is provided by at least one filled via 208 or 210, configured to intersect both the conductive line 206 and the local interconnect 202. An additional electrical connection is provided by configuring via 210 to intersect the patterned local interconnect 204 and the conductive line 206. In this manner, the portion of the conductive line 206 defined between vias 208 and 210 may be configured to form a fusible link or a resistor.

Preferably, in accordance with one embodiment, the filled enclosed conduit may be configured to form a fusible link. Fuses formed on semiconductor wafers perform one of several functions. Fuses may be formed to provide overcorrect protection. More typically, fuses are formed to activate and deactivate redundant functions such as redundant cells in memory chips. In addition, fuses may be formed to activate and deactivate fusible links in programmable logic devices. PLD's provide a large array of conventional elements such as gates which can be customized for an application by activating or deactivating selected cells in selected configurations to yield a desired circuit configuration. The use of the conduit formed in accordance with the techniques described herein offer several advantages. For example, higher densities can be achieved by compacting the links in a smaller area. Moreover, the smaller size of the links may be severed by laser blowing or other severing techniques without exceeding the thermal budget of the device. Finally, thin conduits may be formed in a selected metal level even where the thickness of the majority of the conductors is too large to yield a practical fusible link.

In accordance with another embodiment, the dimensions of the hollow enclosed conduit may be controlled so that the corresponding dimensions of the resulting conductive line 206 taken with the composition of the conductive line will exhibit the particular fuse or resistor characteristics desired. For example, when the hollow conduit is filled with a refractory material such as tungsten (W) or molybdenum (Mb) the resistance will be very high. As a further example, for a conductive line only about 0.24 microns long, a 60 k ohm resistor may be formed.

In accordance with an alternative embodiment, the hollow enclosed conduit may be filled with a low melting point material such as aluminum or copper. Very high current densities may easily be achieved at low voltages, resulting in the formation of a fuse.

Figure 2B:
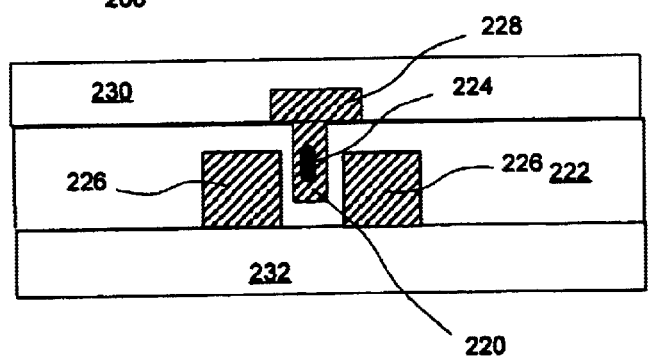
FIG. 2B illustrates a diagrammatic cross-sectional side view of a conductive line in accordance with another embodiment of the present invention.

Although the lateral electrical connections described and illustrated are suitable for electrically accessing the conductive line, the invention is not so limited. The scope of the invention is intended to extend to any and all methods of providing electrical interconnection to the conductive line. In an alternative embodiment as illustrated in FIG. 2B, electrical connection is provided from a metal layer 228 overlying the conductive line 224. FIG. 2B illustrates a diagrammatic cross-sectional side view of the conductive line 224 (i.e., the filled, enclosed conduit) in accordance with another embodiment of the present invention. A via hole 220 is extended from the top surface of the dielectric layer 222 to intersect the conductive line 224 and provide electrical connection thereto. Preferably the via hole enables filling of the hollow encapsulated conduit (i.e., the precursor to the conductive line 224) and after planarization, provides an exposed area for connection with overlying metal layers or other contacts. Methods for depositing additional metal layers and providing electrical interconnection by vias or the like are known to those of skill in the relevant interconnect arts and therefore will not be described in further detail here.

Figure 2C:
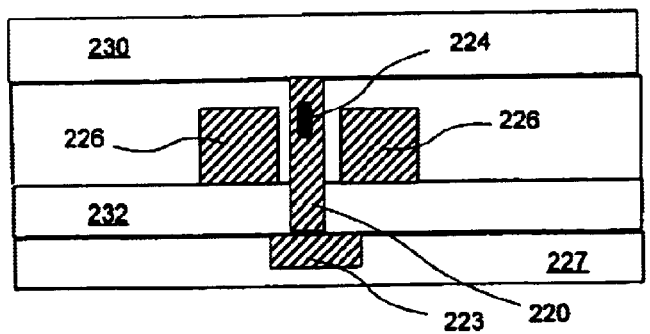
FIG. 2C illustrates a diagrammatic cross-sectional side view of a conductive line in accordance with another embodiment of the present invention.

According to yet another alternative embodiment, the conductive lined formed by the preceding methods may be connected electrically to an underlying contact or metal layer. As illustrate in diagrammatic form in FIG. 2C, the via hole 220 may be extended to contact a metal layer or contact 223 in an underlying layer 227 or the substrate. For example, the via hole may be extended to stop on the underlying layer 227, for example by using endpoint detection techniques or by using an etch stop layer. Preferably, the via holes are etched using a dry plasma etch technique to take advantage of the anisotropic properties of the plasma etching. Thus, as illustrated in FIGS. 2A–C, the enclosed conduit may be electrically connected to other interconnects on the same layer as the conduit, a layer above the conduit, or below the conduit. As discussed above, the enclosed conduit may be formed in any of a variety of layers, e.g., in a trench formed in the substrate or an oxide layer on the substrate, or in a PMD or IMD dielectric layer, or between polysilicon or metal lines.

Figure 3A:
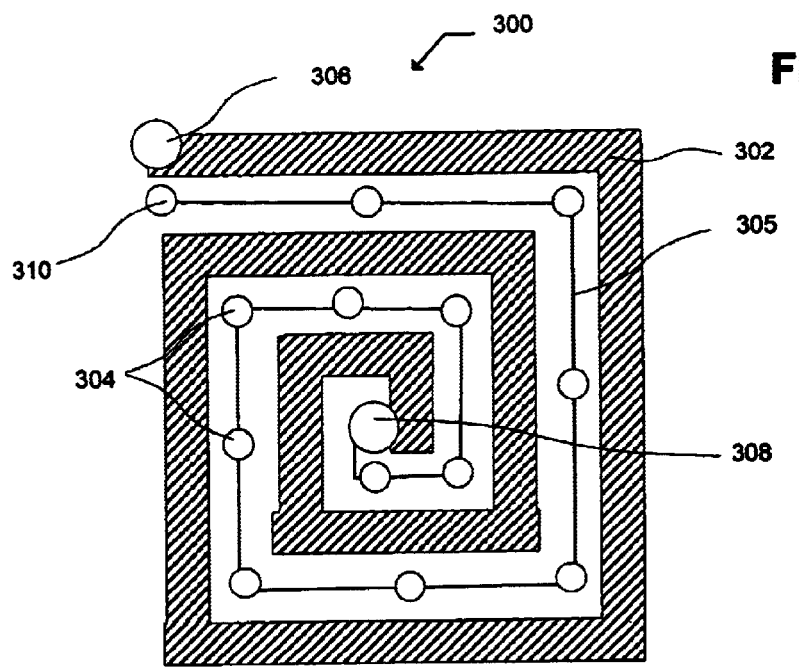
FIG. 3A is a top diagrammatic view illustrating an inductor formed in accordance with the methods of the present invention.

As discussed, selecting the topography of the patterned layer upon which the dielectric is deposited is important to the configuration of the hollow enclosed conduit. In order to form an inductor, The structure may be configured in a spiral shape as illustrated in FIG. 3. FIG. 3 is a top diagrammatic view illustrating an inductor formed in accordance with the methods of the present invention. Spiral inductors formed by the described method offer high levels of integration and low production cost. Preferably, the desired structure for forming the spiral inductor 300 is created initially by patterning a conductive layer 302 in a spiral pattern. The conductive layer 302 is formed so that the "trench" between the rings of the pattern has sufficient steepness on at least one sidewall to permit formation of the hollow enclosed conduit when the dielectric layer is deposited. As shown and consistent with the formation methodology described above, via holes 304 are spaced at selected intervals along the hollow conduit 305 to enable filling of the conduit by metal or other conductor. That is, the via holes 304 are spaced so that the distance between adjacent via holes is equal to or less than the maximum full distance determined for the process. Preferably, the terminals of the inductor 300 include a via 306 connecting to the patterned layer at the outside of the spiral and a via hole 310 intersecting the hollow conduit 305. Preferably, the hollow conduit 305 is connected to the patterned structure 302 at the center of the spiral to form this double looped inductor, although the scope of the invention is not limited to this configuration of inductor.

Figure 4A:
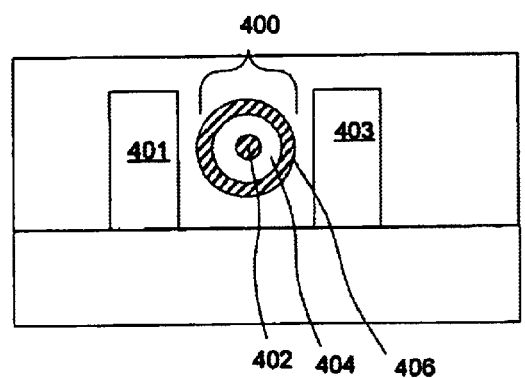
FIG. 4A is a diagrammatic cross-sectional view of a coaxial cable formed in accordance with one embodiment of the present invention.

In accordance with yet another embodiment, the hollow enclosed conduit is configured to form a coaxial cable. FIG. 4A is a diagrammatic cross-sectional view of a coaxial cable formed in accordance with one embodiment of the present invention. The hollow enclosed conduit may be filled by depositing multiple layers of conductors and insulators. FIG. 4A is illustrative of a coaxial conductive line 400 formed by an inner conductor 402, an insulator 404, and an outer conductor 406. Preferably, the coaxial conductive line 400 is formed by first forming a hollow enclosed conduit, i.e. a tunnel, as the dielectric layer is deposited in accordance with the techniques described above. For example, the hollow enclosed conduit is defined by filling the gap between metal lines 401 and 403. Deposition and gap conditions are controlled so that the hollow conduit is large enough to accommodate several layers, i.e., at least two conductive layers separated by an insulator layer. After the hollow conduit is created, the outer conductive layer 406 is deposited, preferably by chemical vapor deposition techniques (CVD). Next, the insulator layer 404 is deposited, preferably by CVD techniques. Suitable insulator layers formed by CVD or other deposition techniques include vapor phase deposition (such as parylene, coated from dimer, di-para-xylene) and ALD. Next, the inner conductor 402 is deposited, preferably to fill the enclosed conduit to complete the formation of the coaxial conductor structure 400. Although the invention is illustrated with two conductor layers and an insulator, the invention is not so limited. The scope of the invention is intended to extend to any combination of conductors and insulator layers for filling the enclosed conduit. Preferably, a trench having an aspect ratio of 1 or greater is used to form the coaxial conductor.

Figure 4B:
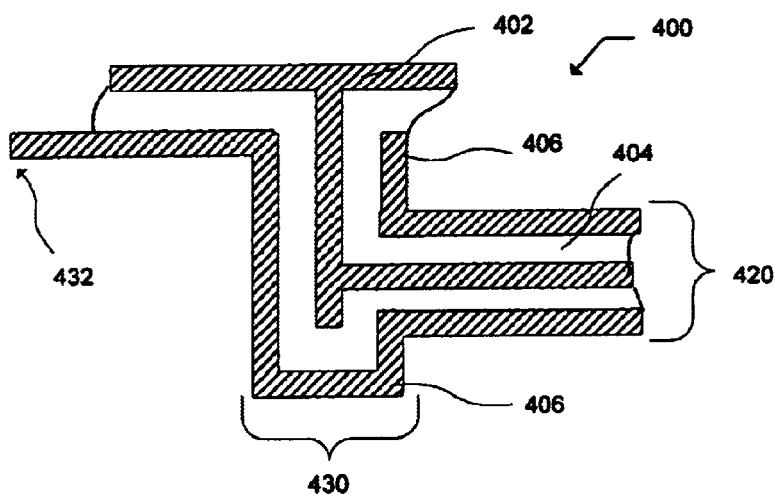
FIG. 4B is a diagrammatic cross-sectional side view of a coaxial cable formed in accordance with one embodiment of the present invention.

FIG. 4B is a diagrammatic sectional view of the coaxial cable 400 of FIG. 4A, taken along the axis of the conductor, to illustrate a method of electrical connection to the coaxial conductor lines. As illustrated, the coaxial conduit 420 includes inner conductor 402, insulator 404, and outer conductor 406. A via hole 430 is shown intersecting the conduit 420. In the process of depositing sequentially the outer conductor 406, the insulator 404, and the inner conductor 402, the identified layers are stacked in the same sequence on the top of the via 430, as well as on the surface adjacent to the via. By patterning and etching the exposed inner conductor 402, followed by etching of the insulator 404, the outer conductor 406 may be exposed for electrical connection at point 432. Electrical connection may also be made to the exposed portions of the inner conductor at the top of the via 430.

Figure 5A:
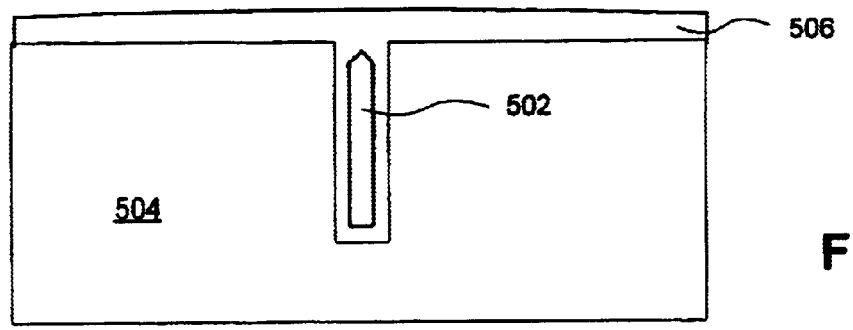
FIG. 5A is a diagrammatic cross-sectional view of a rectangular conduit formed in accordance with one embodiment of the present invention.

The configuration of the hollow conduit varies in accordance with a number of different parameters. For example, the hollow conduit may in one embodiment have a substantially circular cross-section. In accordance with another embodiment, the topography of the first layer on the substrate (i.e., the trench) may be configured so that a hollow conduit having a rectangular cross-section is formed. As illustrated in FIG. 5A, by selecting the topography of layer 504 so that the gap or trench has an aspect ratio preferably of 2 or more, an enclosed conduit 502 having a substantially rectangular cross-section is formed in dielectric 506. This is believed to be advantageous for the formation of certain passive devices from the conductive lines. For example, capacitors may be formed in one embodiment from the conductive lines formed in accordance with the methods of the present invention.

Figure 5B:
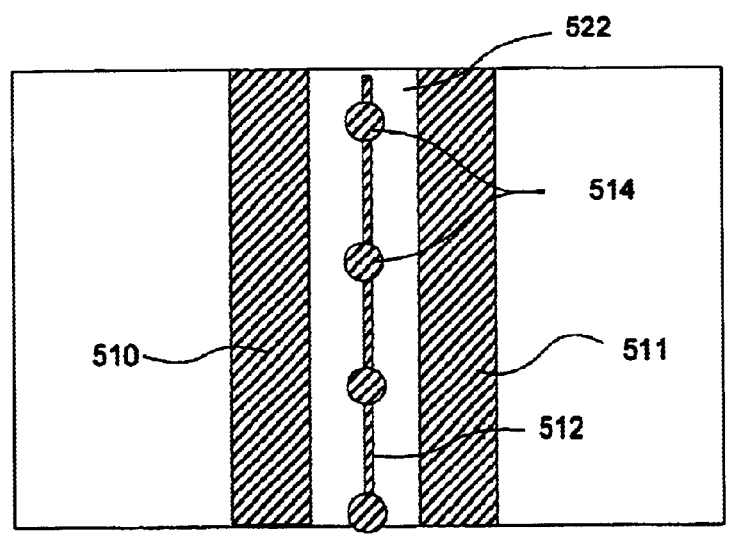
FIG. 5B is a top diagrammatic view of a capacitor formed in accordance with one embodiment of the present invention.
Figure 5C:
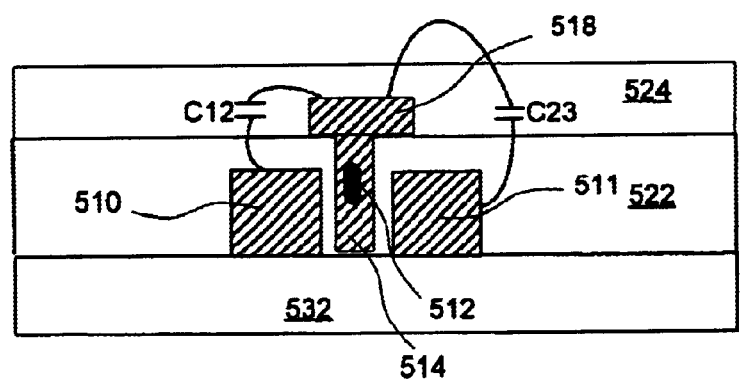
FIG. 5C is a diagrammatic cross-sectional view of the capacitor of FIG. 5B, formed in accordance with one embodiment of the present invention.

As illustrated in FIGS. 5B–C, a hollow conduit of rectangular cross section may be configured in conjunction with the patterned topography to form a circuit capacitor. A capacitor is a physical device consisting of two pieces of conducting material separated by an insulating material or dielectric. Here, the capacitor is formed as shown in the top view of FIG. 5A, by three pieces of conducting metal, i.e., the patterned metal lines 510, 511 forming the structure that defines the trench and the filled hollow conduit 512. Capacitance is generally proportional to the area of the plate surfaces and the dielectric constant but inversely proportional to the distance between the plates. The value of the dielectric constant is dependent upon the type of dielectric used. The capacitor is shown with a plurality of via holes 514 located at intervals along the filled conduit 512.

FIG. 5C is a cross-sectional side view of the capacitor 500 illustrated in FIG. 5B. Preferably, the via 514 connects the filled conduit 512 to an overlying metal layer 518, i.e., metal layer $m_{x+1}$. Thus, the overall capacitance is the sum of the capacitances between the filled conduit 512 and the patterned metal lines 510 and 511. That is, the overall capacitance is the sum of $C_{12}$ and $C_{23}$. The cross-sectional view illustrates the metal line 518 ($m_{x+1}$) as having a size approximating that of the patterned lines 510, 511. However, the overlying metal line $m_{x+1}$, though not illustrated in the top views of FIG. 5A, is sufficiently distant from the underlying metal lines 510, 511 so as to contribute little to the overall capacitance. Instead, the rectangular cross-sectioned conductive line 512 provides the capacitance effect relative to the patterned lines 510, 511. Preferably the patterned lines 510, 511 are metal lines such as formed in one of the metal lines forming interconnects according to conventional techniques.

The present invention overcomes problems in the formation of conventional fuses, resistors, interconnects, capacitors, and inductors by forming features that can be much smaller than the minimum patterned feature available from the technology using conventional patterning and etching techniques. The lines and components formed according to the described methods are reproducible and controllable. They are especially suitable for the formation of fuses. For example, when filled with a low melting point material such as aluminum, critical current densities required for the fuse can be easily achieved at low voltages. By forming and filling the enclosed conduit as described, an additional layer may be formed between other layers without the requirement of additional masking. The distinct interconnect layer so formed can increase the density of the chip. Further, the additional interconnect layer can be formed without etching, thus suitable for use with metals such as copper (Cu) or molybdenum (Mb) which do not etch easily.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a conductive line on a semiconductor wafer, the method comprising:
   forming a trench on the semiconductor wafer;
   depositing a dielectric material in the trench so that a hollow enclosed conduit is formed within the dielectric material in the trench; and
   forming at least one via hole in the dielectric material deposited in the trench and configured to intersect the hollow enclosed conduit; and
   filling the hollow conduit by using the at least one via hole to thereby form the conductive line.

2. The method of forming a conductive line as recited in claim 1, wherein the hollow conduit is filled with a conductive material.

3. The method of forming a conductive line as recited in claim 2, wherein the conductive material is one of Ti, TiN, W, Al, Cu, and Mb.

4. The method of forming a conductive line as recited in claim 2, wherein the conductive line is configured in a spiral shape to form an inductor.

5. The method of forming a conductive line as recited in claim 2, wherein the conductive line forms a fusible link in a circuit.

6. The method of forming a conductive line as recited in claim 2, wherein the conductive line is hollow and further comprising filling the hollow conductive line with a dielectric material in an annular shape and filling the space defined by the annular shape with a conductive material to form a second conductive line.

7. The method of forming a conductive line as recited in claim 6, wherein the first and second conductive lines form a coaxial conductor.

8. The method of forming a conductive line as recited in claim 2, wherein the trench has an aspect ratio greater than or equal to 1.

9. The method of forming a conductive line as recited in claim 1, wherein the deposition of the dielectric material is controlled so that the top part of the enclosed conduit is formed by mushrooming of the overhang on the sides of the trench.

10. The method of forming a conductive line as recited in claim 1, wherein the trench is formed by etching one of a silicon substrate of the semiconductor wafer or an oxide layer formed on the wafer.

11. The method of forming a conductive line as recited in claim 1, wherein the trench is formed by at least two prominences on a patterned layer on the wafer.

12. The method of forming a conductive line as recited in claim 11, wherein at least one of the at least two prominences comprises an interconnect line.

13. The method of forming a conductive line as recited in claim 1, wherein the filling the hollow conduit comprises one of a chemical vapor deposition, plasma enhanced chemical vapor deposition, and atomic layer deposition method.

14. The method of forming a conductive line as recited in claim 1, wherein the depositing the dielectric in the trench comprises one of a chemical vapor deposition and physical vapor deposition method.

15. The method of forming a conductive line as recited in claim 1, wherein the at least one contact hole comprises a plurality of contact holes and wherein the adjacent of the plurality of contact holes are positioned less than a predetermined maximum fill distance length apart.

16. The method of forming a conductive line as recited in claim 1, wherein the conductive line is configured to form one of a fuse, an interconnect, a resistor, a capacitor, and an inductor.

17. A method of forming a signal transmission line on a semiconductor wafer, the method comprising:
   forming a channel within a first layer on the semiconductor wafer;
   depositing a dielectric material in the channel, wherein the dielectric material and the channel configurations are selected so that a hollow enclosed conduit is formed in the channel;
   forming at least one via hole in the dielectric material deposited in the channel and configured to intersect the hollow enclosed conduit; and filling the via hole and the hollow enclosed conduit with a first material to thereby form the signal transmission line, whereby the first material is one of a dielectric and a conductor.

18. The method of forming a signal transmission line as recited in claim 17, wherein the first material is a dielectric configured for transmitting optics.

19. A semiconductor integrated circuit formed by:

forming a channel within a first layer on a semiconductor wafer;

depositing a dielectric material in the channel, wherein the dielectric material and the channel configurations are selected so that a hollow enclosed conduit is formed in the channel;

forming at least one via hole in the dielectric material deposited in the channel and configured to intersect the hollow enclosed conduit; and filling via hole and the hollow enclosed conduit with a first conductive material to form a conductive metal line.

20. The semiconductor integrated circuit of claim 19 wherein the conductive metal line is configured in a spiral shape to form an inductor.

21. The semiconductor integrated circuit of claim 19 wherein the conductive metal line is configured to form one of a fusible link, resistor, capacitor, and interconnect line.

* * * * *